United States Patent
Trampitsch

(10) Patent No.: US 12,381,541 B2
(45) Date of Patent: Aug. 5, 2025

(54) MANAGING CAPACITOR VOLTAGE DEPENDENCE

(71) Applicant: Analog Devices International Unlimited Company, Limerick (IE)

(72) Inventor: Gerd Trampitsch, Munich (DE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 18/200,426

(22) Filed: May 22, 2023

(65) Prior Publication Data
US 2024/0396537 A1    Nov. 28, 2024

(51) Int. Cl.
*H03K 5/01*    (2006.01)
*H03K 5/02*    (2006.01)
*H03K 5/24*    (2006.01)

(52) U.S. Cl.
CPC .................. *H03K 5/01* (2013.01); *H03K 5/02* (2013.01); *H03K 5/24* (2013.01)

(58) Field of Classification Search
CPC ... H03K 5/01; H03K 5/02; H03K 5/24; H01L 27/0805; H01L 28/40; H01L 28/75; H01G 2/00; H01G 4/30; H01G 4/306; H01G 4/33; H01G 4/38; H01G 4/385; H01G 7/06; H01G 4/20; H01G 4/06; H01G 4/018
See application file for complete search history.

(56) References Cited

U.S. PATENT DOCUMENTS

| 4,918,454 A | 4/1990 | Early et al. |
| 2012/0211868 A1 | 8/2012 | Stribley et al. |

FOREIGN PATENT DOCUMENTS

CN    119002609 A    11/2024

OTHER PUBLICATIONS

"European Application Serial No. 24174896.1, Extended European Search Report mailed Oct. 31, 2024", 15 pgs.
Bruschi, P., "Passive components in Integrated Circuits", [Online]. Retrieved from the Internet: <URL :http://docenti.ing.unipi.it/~a008309/mat_stud/PSM/Archive/2017/lecture_notes/02_Passive_components.pdf>, (May 28, 2017), 1-10.

*Primary Examiner* — Jung Kim
(74) *Attorney, Agent, or Firm* — Schwegman Lundberg & Woessner, P.A.

(57) ABSTRACT

A system for reducing a voltage-dependent effect of a first capacitor caused by a first voltage may include the first capacitor, which may include a first physical spacing between a first capacitor terminal conductor of the first capacitor and a second capacitor terminal conductor of the first capacitor. The system may also include a second capacitor, which may include a second physical spacing between a first capacitor terminal conductor of the second capacitor and a second capacitor terminal conductor of the second capacitor, where the second physical spacing is different from the first physical spacing. The system may also include a compensation circuit, which may be arranged to receive and at least partially offset a voltage dependent signal contribution from each of the first and second capacitors for output to a signal-processing circuit.

17 Claims, 5 Drawing Sheets

MANAGING CAPACITOR VOLTAGE DEPENDENCE

TECHNOLOGICAL FIELD

The present disclosure relates to electronics, and more particularly, but not by way of limitation, to systems and methods for managing capacitor voltage dependence.

BACKGROUND

Electronic systems can use a capacitor for many purposes. For example, capacitors may be used to store charge, or transfer charge, or both. A capacitor may have a capacitance value that is expressed in terms of the ratio of charge stored to voltage across the capacitor. The capacitance value of a capacitor may change depending upon the voltage across the capacitor.

SUMMARY

A change in capacitance depending upon voltage level may result in a nonlinearity in the capacitor performance. The nonlinearity may be due to a voltage dependent property of the dielectric. The nonlinearity in a capacitor may be transferred in part or in whole to the circuit the capacitor is used in, which may cause a nonlinearity in the circuit. In an approach, the capacitor plate spacing may be increased to decrease a voltage coefficient of the capacitor. However, this may result in an increased capacitor size to achieve the same capacitance value.

The present inventors have recognized, among other things, that it may be desirable to manage capacitor voltage dependence. For example, a system may be configured to help remove a portion or all of the voltage dependence of a capacitor. Reducing a nonlinearity in a capacitor or capacitor network may help reduce a nonlinearity in the system. It may be desirable to reduce the voltage dependence of a capacitor without increasing the plate spacing or size of the capacitor.

The present inventors have recognized, among other things, that a battery monitoring system may include at least one analog-to-digital converter (ADC) that experiences a large common-mode input. For example, an ADC that is measuring an approximately four volt cell voltage near the top of a battery module may have a common mode input of over 100 V due to the series construction of the module. It may be desirable for this ADC to have a large common-mode rejection ratio (CMRR) to help more accurately measure the battery cell voltage. The CMRR of the ADC may be limited in part by the nonlinearity, or voltage dependence, or both, of a capacitor in the ADC. For example, the ADC may include one or more capacitors in a first stage (e.g., an input or sampling stage) that may transfer their nonlinearity to the resulting digital value.

In an example, a system for reducing a voltage-dependent effect of a first capacitor caused by a first voltage may include the first capacitor, which may include a first physical spacing between a first capacitor terminal conductor of the first capacitor and a second capacitor terminal conductor of the first capacitor. The system may also include a second capacitor, which may include a second physical spacing between a first capacitor terminal conductor of the second capacitor and a second capacitor terminal conductor of the second capacitor, where the second physical spacing is different from the first physical spacing. The system may also include a compensation circuit, which may be arranged to receive and at least partially offset a voltage dependent signal contribution from each of the first and second capacitors for output to a signal-processing circuit.

In an example, a method for reducing a non-linear effect of a first capacitor caused by a first voltage coefficient of the first capacitor may include using the first capacitor, including a first physical spacing between a first capacitor terminal conductor of the first capacitor and a second capacitor terminal conductor of the first capacitor, to provide a first voltage-dependent contribution. The method may also include using a second capacitor, including a second physical spacing between a first capacitor terminal conductor of the second capacitor and a second capacitor terminal conductor of the second capacitor, to provide a second voltage-dependent contribution, where the second physical spacing may be different from the first physical spacing. The method may also include receiving, using a compensation circuit, the first voltage-dependent contribution and the second voltage-dependent contribution, wherein the second voltage-dependent contribution at least partially offsets the first voltage-dependent contribution.

In an example, a system for reducing a non-linear effect of a first capacitor caused by a first voltage coefficient of the first capacitor may include the first capacitor, coupled between a first port and a second port. The system may also include a second capacitor, coupled between the first port and a third port, where the system is configured such that a capacitance coupled between the first port and the third port has a subtractive effect relative to an effect of a capacitance coupled between the first port and second port, where the first voltage coefficient of the first capacitor is different than a second voltage coefficient of the second capacitor.

BRIEF DESCRIPTION OF THE DRAWINGS

In the drawings, which may not be drawn to scale, like numerals may describe substantially similar components throughout one or more of the views. Like numerals having different letter suffixes may represent different instances of substantially similar components. The drawings illustrate generally, by way of example but not by way of limitation.

DETAILED DESCRIPTION

Figure 1:
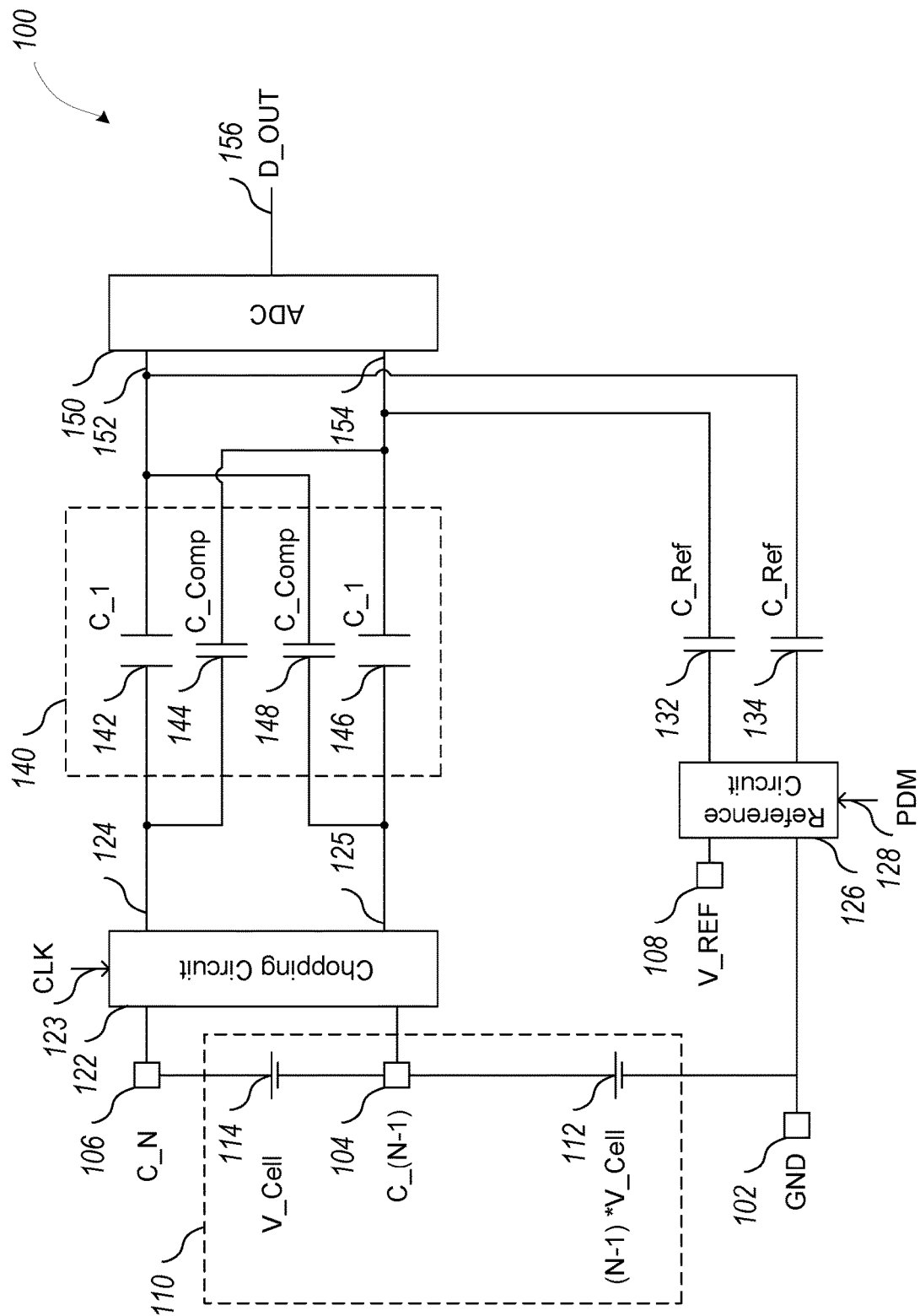
FIG. 1 is a schematic drawing of an example of portions of an analog-to-digital converter (ADC) system including portions of a circuit configured to reduce a capacitor voltage-dependent effect of a capacitor.

The capacitance of an ideal capacitor is defined by equation 1.

$$C = Q/V = \text{constant} \qquad \text{Equation 1}$$

In equation 1, C is the capacitance, Q is the positive charge stored on a positive plate of the capacitor, and V is the voltage between the positive plate and negative plate. In an ideal capacitor, the capacitance is a constant value across all voltages. However, a physical capacitor may differ from ideal behavior in one or more ways. For example, the capacitance value may not be constant but may differ between one or more voltage levels.

The capacitance of a nonideal physical capacitor may be defined by equation 2.

$$C = C_0(1 - a_1 * V - a_2 * V^2 - a_3 * V^3 ... )  \quad \text{Equation 2}$$

In equation 2, $C_0$ is the zero voltage capacitance of the capacitor. The nonlinear voltage coefficients, (i.e., $a_1$, $a_2$, $a_3$, etc.) may each be one or more of positive, negative, or zero. For example, a capacitor may have a first order voltage coefficient $a_1$ that is zero, but a second order voltage coefficient $a_2$ with a positive value. There may be an infinite number of nonlinear voltage coefficients.

The voltage dependence of a capacitor may be caused in part by a nonlinear property of the dielectric between capacitor plates. For example, the dielectric may have one or more properties that are voltage dependent, such as may include the permittivity of the dielectric. The capacitance of a capacitor may also be defined by equation 3.

$$C = \epsilon A/d  \quad \text{Equation 3}$$

In equation 3, e is the permittivity, A is the area of the capacitor plates, and d is the distance between the capacitor plates. Equation 3 shows that a voltage-dependent effect of permittivity may translate to a voltage-dependent effect of capacitance. The voltage dependence of permittivity may be defined in terms of the voltage gradient (i.e., electric field) in the dielectric. The electric field in the dielectric may be defined by equation 4.

$$E = V/d \quad \text{Equation 4}$$

In equation 4, E is the electric field strength in the dielectric. By altering the plate spacing of a capacitor, the electric field strength in the dielectric may be altered. This may also alter the voltage dependent effect of a capacitor. For example, larger plate spacings may result in a lower electric field in the dielectric, which may result in the nonlinearity of the capacitor decreasing. However, increasing the plate spacing may reduce the capacitance for a given plate area which may result in one or more of the capacitor taking up more space or being more expensive.

The equations discussed above may apply to parallel plate capacitors. However, these equations may be adopted to apply to any capacitor construction, and this disclosure is intended to apply to all capacitor constructions. Various other capacitor constructions may include one or more of rolled capacitor, finger capacitor, polar capacitor, nonpolar capacitor, or interleaved capacitors. Additionally, a capacitor may be constructed by combining one or more capacitors in series or parallel.

FIG. 1 is a schematic drawing of an example of portions of an analog-to-digital converter (ADC) system 100 including portions of a circuit configured to reduce a capacitor voltage-dependent effect of a capacitor. FIG. 1 shows that the ADC system 100 may include a ground reference pin 102, a voltage reference pin 108, a first input pin 106, a second input pin 104, and a digital output connection 156. The ADC system 100 may also include a reference circuit 126, a chopping circuit 122, and an ADC 150.

The ADC system 100 may be configured to measure the voltage of one or more cells in a battery module 110. The battery module may include one or more cells, and may include cells in one or more of a series arrangement or parallel arrangement. In an example, the battery module may include N cells in series, and the ADC system 100 may be configured to measure the voltage of the Nth cell. The second input pin 104 may be coupled to the bottom of the cell to be measured 114 and may receive signal that is equal to the total voltage of the battery less the Nth cell. The first input pin 106 may be coupled to the top of the cell to be measured 114 and may receive a signal that is equal to the total voltage of the battery. This may result in the voltage of signals received on the second input pin 104 and the first input pin 106 both having a positive value, such as may result in a common-mode signal. For example, the voltage of the second input pin 104 may be equal to the voltage of the remaining cells 112. In an example, the common-mode signal may include a voltage of 30 volts, 45 volts, 60 volts 75 volts, 100 volts, or 150 volts.

The chopping circuit 122 may be coupled to the first input pin 106 and the second input pin 104, and may receive a clock signal on the clock input pin 123. The chopping circuit 122 may include one or more switches that are configured to provide a chopped representation of the of the signal received on the first input pin 106 to the first chopped input pin 124 and a chopped representation of the signal received on the second input pin 104 to the second chopped input pin 125. The chopping circuit 122 may convert the continuous time analog signals received on one or more of the first input pin 106 or the second input pin 104 to discrete time signals on one or more of the first chopped input pin 124 or the second chopped input pin 125.

The chopping circuit 122 may form part of a first stage of the ADC system 100, such as may sample the voltage to be converted onto one or more capacitors in the capacitor network 140. The frequency of the clock signal received on the clock input pin 123 may match the conversion frequency of the ADC 150.

The ADC 150 may include a first input 152 a second input 154, and a digital output connection 156. The ADC 150 may be a differential ADC, and may generate a digital signal indicative of a difference between a signal on the first input 152 and a signal on the second input 154 on the digital output connection 156. The ADC 150 may convert the analog signal received on the first input 152 and the second input 154 to a digital signal on the digital output connection 156 using analog-to-digital conversion circuitry employing a conversion technique such as may include one or more of delta-sigma, successive approximation, flash, or integration.

The capacitor network 140 may include a first sampling capacitor 142, a first compensation capacitor 144, a second sampling capacitor 146, and a second compensation capacitor 148. The first sampling capacitor 142 may include a first terminal conductor coupled to the first chopped input pin 124 and a second terminal conductor connected to the first input 152. The second sampling capacitor 146 may include a first terminal conductor coupled to the second chopped input pin 125 and a second terminal conductor coupled to the second input 154. The first compensation capacitor 144 may include a first capacitor terminal conductor coupled to the first chopped input pin 124 and a second capacitor terminal conductor coupled to the second input 154. The second compensation capacitor 148 may include a first capacitor terminal conductor coupled to the second chopped input pin 125 and a second capacitor terminal conductor coupled to the first input 152. The first sampling capacitor 142 and the second sampling capacitor 146 may be coupled between the chopping circuit 122 and the ADC 150. The first compensation capacitor 144 and the second compensation capacitor 148 may be cross-coupled between the chopping circuit 122 and the ADC 150.

The first sampling capacitor 142 may include a first physical spacing between the first capacitor terminal conductor and the second capacitor terminal conductor. The first compensation capacitor 144 may include a second physical spacing between the first capacitor terminal conductor and the second capacitor terminal conductor. The second physical spacing may be different from the first physical spacing. For example, FIG. 1 shows the first sampling capacitor 142 as having a larger physical spacing than the first compensation capacitor 144. The smaller physical spacing of the first compensation capacitor 144 may result in the first compensation capacitor 144 having a greater voltage-dependent effect than the first sampling capacitor 142. The second sampling capacitor 146 may have a physical spacing that is the same as the first sampling capacitor 142 or may have a different physical spacing. The second compensation capacitor 148 may have a physical spacing that is the same as the first compensation capacitor 144 or may have a different physical spacing.

The capacitance of the first sampling capacitor 142 may be the same as the capacitance of the second sampling capacitor 146, or the capacitance of the first sampling capacitor 142 may differ from the capacitance of the second sampling capacitor 146. The capacitance of the first compensation capacitor 144 may be the same as the capacitance of the second compensation capacitor 148 or the capacitance of the first compensation capacitor 144 may differ from the capacitance of the second compensation capacitor 148. One or more capacitors in the capacitor network 140 may include one or more of a parallel plate style construction or a finger style construction. One or more of the capacitors in the capacitor network 140 may form a portion of a monolithic integrated circuit, such as may include the capacitor being manufactured during the integrated circuit manufacturing process.

The reference circuit 126 may accept as inputs the signal on the ground reference pin 102, the signal on the voltage reference pin 108, and a pulse decimated modulation (PDM) signal on the PDM node 128. The signal on the ground reference pin 102 may be an earth ground reference or floating ground reference, such as may include the ground reference of a vehicle. The signal on the voltage reference pin 108 may include a reference voltage signal, such as may be used to provide a reference for the ADC 150. The PDM signal received on the PDM node 128 may be a clock signal matching the frequency of the signal on the clock input pin 123, or the frequency may be different. A phase of the signal on the PDM node 128 may differ from a phase of the signal on the clock input pin 123. The PDM signal received may be an analog or digital duty cycle modulation signal, such as may allow for a selection of the effective reference voltage provided to the ADC 150.

The reference circuit 126 may include one or more switches that are configured to provide a chopped representation of the signal received on the ground reference pin 102 to a first terminal conductor of the second reference capacitor 134 and a chopped representation of the signal received on the voltage reference pin 108 to a first terminal conductor of the first reference capacitor 132. The second terminal conductor of the first reference capacitor 132 may be coupled to the second input 154 and the second terminal conductor of the second reference capacitor 134 may be coupled to the first input 152.

The ADC system 100 may be configured such that the signal on the digital output connection 156 is defined by equation 5.

$$D_{out} = V_{cell} * C_s / (C_{ref} * V_{ref}) \qquad \text{Equation 5}$$

In equation 5 $D_{out}$ is the digital representation of the analog signal carried by the digital output connection 156, $V_{cell}$ is the voltage of the cell to be measured 114, $C_s$ is the equivalent sampling capacitance defined by equation 6, $C_{ref}$ is the capacitance of the first reference capacitor 132 and the second reference capacitor 134, and $V_{ref}$ is the voltage of the signal on the voltage reference pin 108. The equivalent sampling capacitance is defined by equation 6.

$$C_s = C_1 - C_{Comp} \qquad \text{Equation 6}$$

In equation 6, $C_1$ is the capacitance of the first sampling capacitor 142 and the second sampling capacitor 146 and $C_{comp}$ is the capacitance of the first compensation capacitor 144 and the second compensation capacitor 148.

Equation 6 shows that the cross-coupled compensation capacitors 144 & 148 have a subtractive effect with respect to the sampling capacitors 142 & 146. The capacitance of the cross-coupled compensation capacitors 144 & 148 may at least partially offset a capacitance of the sampling capacitors 142 & 146. The voltage-dependent signal contribution of the cross-coupled compensation capacitors 144 & 148 may at least partially offset a voltage dependent signal contribution of the sampling capacitors 142 & 146. In this way, the compensation capacitors 144 & 148 may help to manage a voltage dependent effect of the sampling capacitors 142 & 146. For example, the compensation capacitors 144 & 148 may reduce a voltage dependent effect of the sampling capacitors 142 & 146.

If the nonlinearity of the compensation capacitors 144 & 148 is the same as the nonlinearity of the sampling capacitors 142 & 146 (i.e., the non-linear voltage coefficients are the same), the equivalent capacitance may have the same nonlinearity as the sampling capacitors 142 & 146 (i.e, the non-linear voltage coefficients may be the same). However, if a nonlinearity of the compensation capacitors 144 & 148 is different from a nonlinearity of the sampling capacitors 142 & 146, the equivalent capacitance may have a nonlinearity that is different from the sampling capacitors 142 & 146, such as may include a reduced nonlinearity. Equation 7 defines an equivalent sampling capacitance from a sampling capacitor and a compensation capacitor with a second order voltage coefficient.

$$C_s = C_1(1 - a_{2C_1} * V^2) - C_{comp}(1 - a_{2C_{comp}} * V^2) \qquad \text{Equation 7}$$

In equation 7, $a_{2C_1}$ is the second order voltage coefficient of the sampling capacitor and $a_{2C_{comp}}$ is the second order voltage coefficient of the compensation capacitor. Equation 7 can also be expressed as in equation 8.

$$C_s = (C_1 - C_{comp}) - (C_1 * a_{2C_1} - C_{comp} * a_{2C_{comp}}) * V^2 \quad \text{Equation 8}$$

Equation 8 shows that the equivalent sampling capacitance can be expressed in terms of a base capacitance: $(C_1-C_{comp})$; and a second order voltage coefficient: $(C_1*a_{2C_1}-C_{comp}*a_{2C_{comp}})$. Equation 9 shows a condition in which the second order voltage coefficient may be equal to zero.

$$C_1 * a_{2C_1} = C_{comp} * a_{2C_{comp}} \quad \text{Equation 9}$$

The capacitance values and/or voltage coefficients of one or more of the first sampling capacitor 142, the second sampling capacitor 146, the first compensation capacitor 144, or the second compensation capacitor 148 may be selected to help achieve a desired base effective sampling capacitance while minimizing the second order voltage coefficient. For example, the zero voltage capacitances of the sampling capacitor and compensation capacitor may be selected to achieve the desired base capacitance, and the voltage coefficients may be selected to achieve a desired voltage-dependent effect. In an example, the capacitances and/or voltage coefficients may be selected such that the sampling capacitance multiplied by the sampling voltage coefficient is equal to the compensation capacitance multiplied by the compensation voltage coefficient, such as may result in an effective capacitance with no voltage coefficient (i.e., as shown in equation 9).

Figure 2:
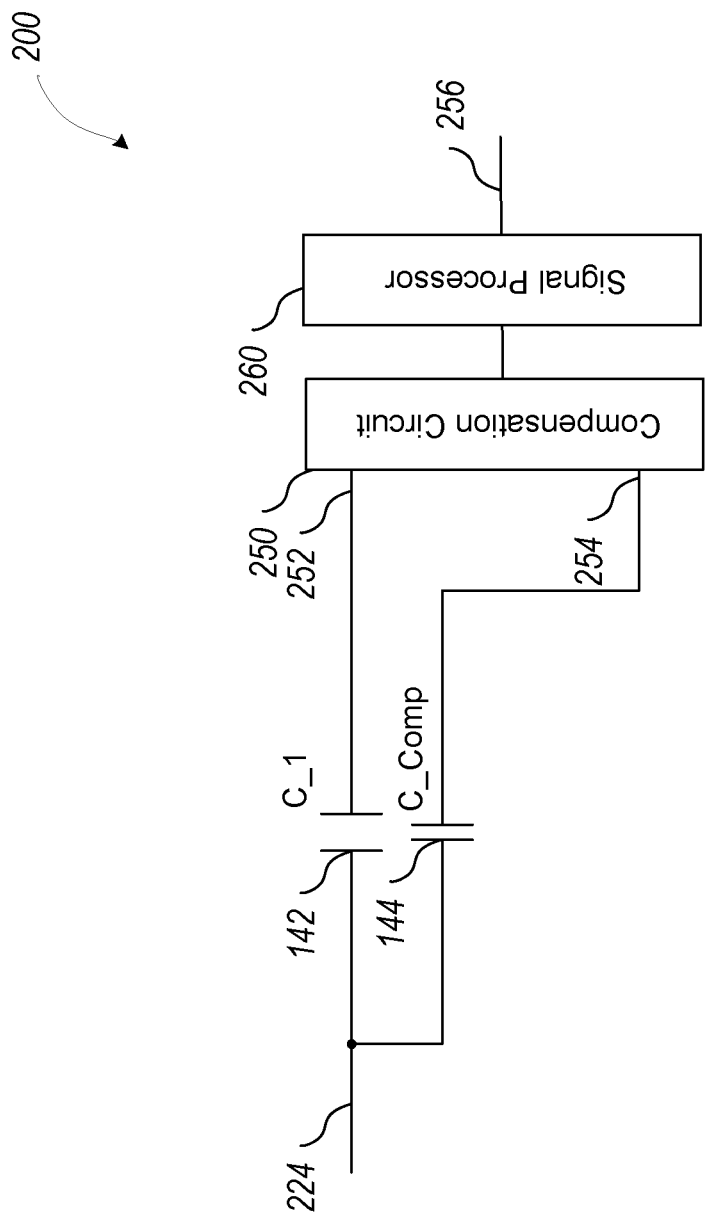
FIG. 2 is a schematic drawing of an example of portions of a circuit for managing a voltage-dependent effect of a capacitor.

FIG. 2 is a schematic drawing of an example of portions of a circuit 200 for managing a voltage-dependent effect of a capacitor. FIG. 2 shows that the circuit 200 may include a capacitor 142 coupled between a first port 224 and a second port 252, and a compensation capacitor 144 coupled between the first port 224 and a third port 254. The circuit 200 may also include a compensation circuit 250, a signal processor 260, and an output node 256.

The first port 224 may receive an input signal, such as may include a signal to be one or more of measured, amplified, or converted. The circuit 200 may be a single-ended ADC circuit that converts a signal received on the first port 224 to a digital signal representation on the output node 256. The circuit 200 may be an amplifier, that amplifies a signal received on the first port 224 for output on the output node 256.

The capacitor 142 may be configured similarly to the capacitor 142 of FIG. 1, or may differ in one or more ways. The compensation capacitor 144 may be configured similarly to the compensation capacitor 144 of FIG. 1 or may differ in one or more ways. The capacitance of the capacitor 142 may differ from the capacitance of the first compensation capacitor 144. A physical terminal spacing of the capacitor 142 may be different than a physical terminal spacing of the compensation capacitor 144. One or more voltage coefficients of the capacitor 142 may differ from one or more voltage coefficients of the compensation capacitor 144. The different voltage coefficients between the capacitor 142 or the compensation capacitor 144 may be achieved using one or more of different plate spacings, different dielectric materials, or different capacitor designs between the capacitor 142 and the compensation capacitor 144. The different voltage coefficients may be achieved by using different finger spacings in finger style capacitors, such as may include finger capacitors on a monolithic integrated circuit. In an example, finger spacing may be easier to adjust than dielectric material or capacitor design.

The compensation circuit 250 may include analog components, digital components, or both. The compensation circuit 250 may be configured such that a capacitance coupled between the first port 224 and the third port 254 has a subtractive effect relative to a capacitance coupled between the first port 224 and the second port 252. For example, the compensation circuit 250 may include a differential ADC similar to FIG. 1. The subtractive effect provided by the compensation circuit 250 may be accomplished in the digital domain, analog domain, or both. For example, the compensation circuit 250 may convert a voltage and/or current signal received on the second port 252 and the third port 254 to digital signals, and then subtract the digital signal corresponding to the compensation capacitor 144 from the digital signal corresponding to the capacitor 142.

A first capacitance of the capacitor 142 and a second capacitance of the compensation capacitor 144 may be selected so that the difference between the first capacitance and the second capacitance provides a desired effective capacitance between the first port 224 and the second port 252. One or more voltage coefficients of the compensation capacitor 144 may be selected to at least partially offset one or more voltage coefficients of the capacitor 142.

There may be more than two capacitors, such as may include three capacitors, four capacitors, five capacitors, or six capacitors. The capacitors may be combined by the compensation circuit 250, such as may include combining using addition, subtraction, or other computations. The use of more than two capacitors may help to allow for the cancellation of multiple voltage coefficients. For example, a first compensation capacitor may be configured to compensate for a first order voltage coefficient and a second compensation capacitor may be configured to compensate for a second order voltage coefficient. The compensation capacitors as a whole may be configured to compensate for one or more voltage dependent effects of the capacitor 142. For example, one or more of the compensation capacitors may subtract from an effect of the capacitor 142 and one or more of the compensation capacitors may add to an effect of the capacitor 142.

In an example, a series of cascaded analog circuits may be used to at least partially offset a voltage dependent effect of the capacitor 142 and the first compensation capacitor 144. For example, two nonlinear amplifiers may be cascaded with a nonlinearity of the second amplifier at least partially offsetting a nonlinearity of the second amplifier.

The signal processor 260 may provide further analog and/or digital signal-processing of a signal from the compensation circuit 250. The signal processor 260 may be a signal-processing circuit. In an example, the compensation circuit 250 and the signal processor 260 may be combined. For example, the compensation circuit 250 and the signal processor 260 may together comprise a differential ADC. In an example, the signal processor 260 may not be included and the compensation circuit 250 may be coupled directly to the output node 256. One or more of the compensation circuit 250, the signal processor 260, or the compensation circuit 250 in combination with the signal processor 260 may form one or more of a filter, an amplifier, an integrator, a summing circuit, or an ADC.

Figure 3:
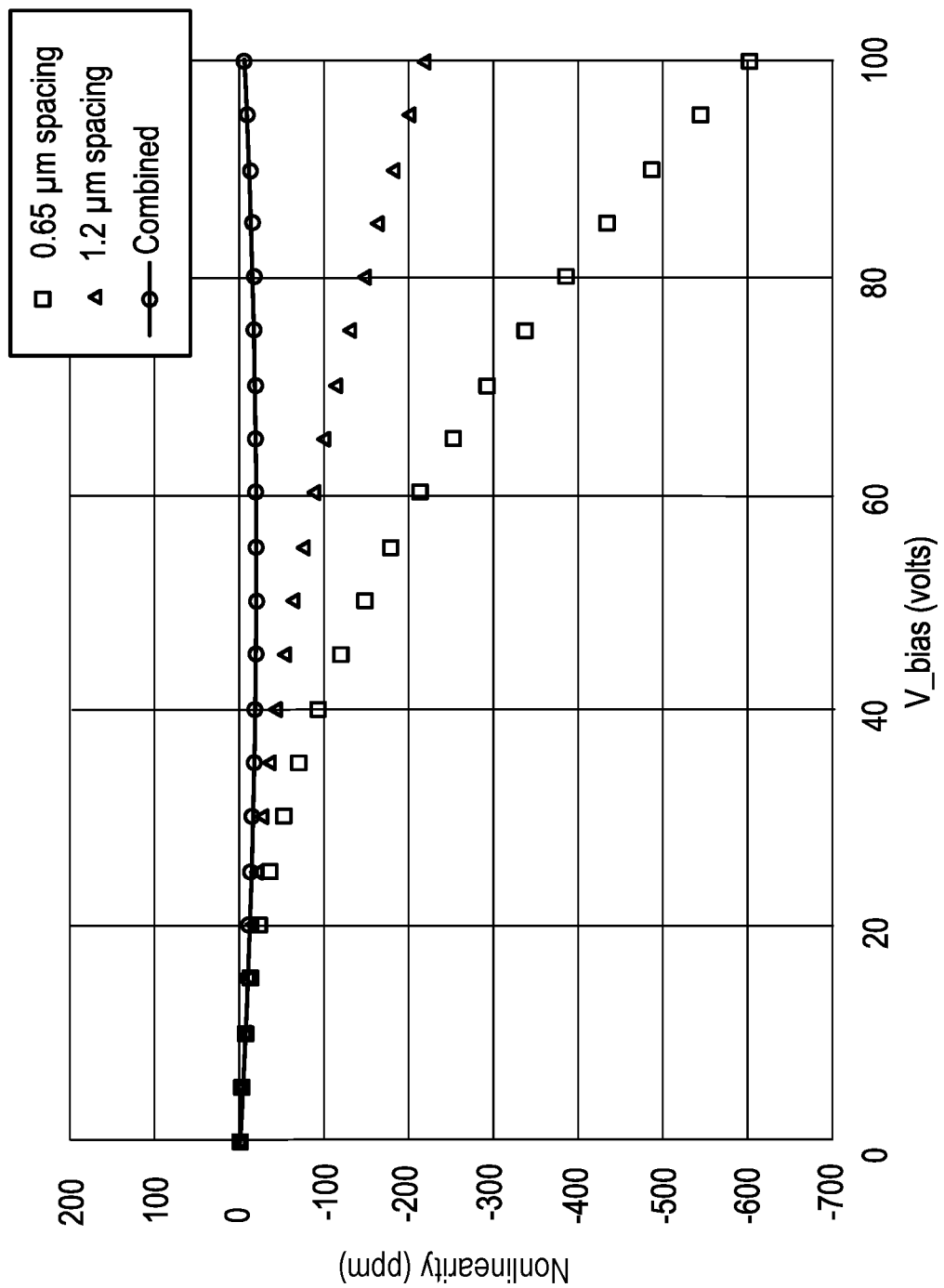
FIG. 3 is a plot showing an example of operating portions of a circuit for managing a voltage-dependent effect of a capacitor.

FIG. 3 is a plot showing laboratory recorded data of an example of operating portions of a circuit for managing a voltage-dependent effect of a capacitor. FIG. 3 shows the voltage nonlinearity of a capacitor with a 0.65 micrometer plate spacing, a capacitor with a 1.2 micrometer plate spacing. FIG. 3 shows the nonlinearity in parts per million (ppm) at different voltages, which describes the nonlinearity as a ratio of the zero voltage capacitance. The nonlinearity of the smaller plate spacing capacitor is greater than the nonlinearity of the larger plate spacing capacitor, such as may be due to a larger voltage gradient in the dielectric. The nonlinearity of both capacitors increases as the voltage is increased, such as may be due to increasing voltage gradient in the dielectric.

FIG. 3 also shows a combined nonlinearity achieved by subtracting a 0.65 micrometer plate spacing capacitor from a 1.2 micrometer plate spacing capacitor of three times greater capacitance than the 0.65 micrometer plate spacing capacitor. FIG. 3 shows that the effective nonlinearity is below 20 ppm across a voltage range of 0 volts to 100 volts. In this way, when the effect of the 0.65 micrometer plate spacing capacitor is subtracted from the effect of the 1.2 micrometer plate spacing capacitor, an effective capacitor with a near zero voltage coefficient is obtained.

Figure 4:
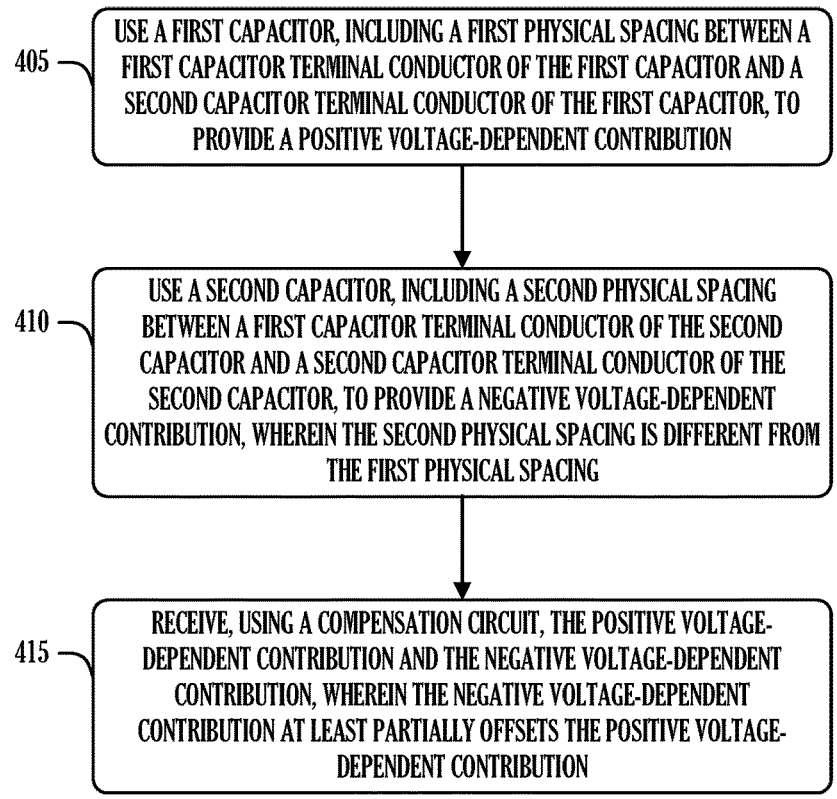
FIG. 4 is a diagram showing an example of a method for operating portions of a system for managing a voltage-dependent effect of a capacitor.

FIG. 4 is a diagram 400 showing an example of a method for operating portions of a system for managing a voltage-dependent effect of a capacitor. At 405, a first capacitor can be used, the first capacitor including a first physical spacing between a first capacitor terminal conductor of the first capacitor and a second capacitor terminal conductor of the first capacitor, to provide a positive voltage-dependent contribution. At 410 a second capacitor can be used, the second capacitor including a second physical spacing between a first capacitor terminal conductor of the second capacitor and a second capacitor terminal conductor of the second capacitor, to provide a negative voltage-dependent contribution, wherein the second physical spacing is different from the first physical spacing. At 415, a compensation circuit can receive the positive voltage-dependent contribution and the negative voltage-dependent contribution, wherein the negative voltage-dependent contribution at least partially offsets the positive voltage-dependent contribution. The shown order of steps is not intended to be a limitation on the order the steps are performed in. In an example, two or more steps may be performed simultaneously or at least partially concurrently.

The first capacitance value in step 405 and the second capacitance value in step 410 may be selected at least in part based upon respective voltage coefficients of the first capacitor and the second capacitor. For example, the capacitance values may be selected to minimize a nonlinearity in the combined effective capacitance value. One or more of the capacitance values may be selected based at least in part upon an experiment conducted using a capacitor including the first physical spacing and a capacitor including the second physical spacing. For example, one or more of the capacitance values may be tuned to achieve a desired compositive voltage dependent effect.

The methods and systems described herein are believed to apply to all capacitor constructions and are not intended to be limited to metal-to-metal capacitors.

Figure 5:
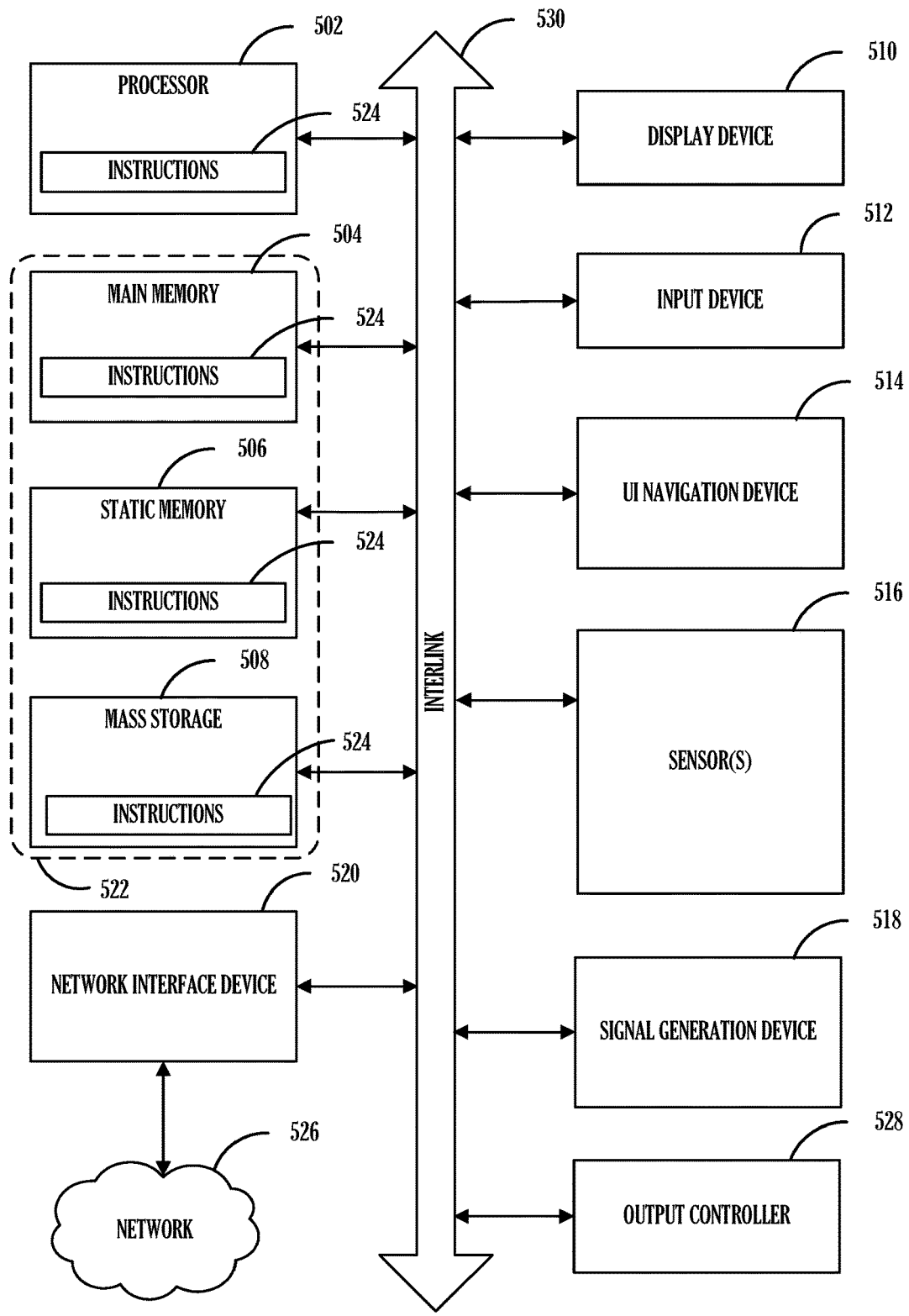
FIG. 5 is a block diagram of an example of portions of a machine upon which one or more portions of the present disclosure may be implemented.

FIG. 5 is a block diagram of an example of portions of a machine 500 upon which one or more portions of the present disclosure may be implemented. Examples, as described herein, may include, or may operate by, logic or a number of components, or mechanisms in the machine 500. Circuitry (e.g., processing circuitry) is a collection of circuits implemented in tangible entities of the machine 500 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 500 follow.

In alternative embodiments, the machine 500 may operate as a standalone device or may be connected (e.g., networked) to other machines. In a networked deployment, the machine 500 may operate in the capacity of a server machine, a client machine, or both in server-client network environments. In an example, the machine 500 may act as a peer machine in peer-to-peer (P2P) (or other distributed) network environment. The machine 500 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 500 may include a hardware processor 502 (e.g., a central processing unit (CPU), a graphics processing unit (GPU), a hardware processor core, or any combination thereof), a main memory 504, a static memory (e.g., memory or storage for firmware, microcode, a basic-input-output (BIOS), unified extensible firmware interface (UEFI), etc.) 506, and mass storage 508 (e.g., hard drives, tape drives, flash storage, or other block devices) some or all of which may communicate with each other via an interlink (e.g., bus) 530. The machine 500 may further include a display unit 510, an alphanumeric input device 512 (e.g., a keyboard), and a user interface (UI) navigation device 514 (e.g., a mouse). In an example, the display unit 510, input device 512 and UI navigation device 514 may be a touch screen display. The machine 500 may additionally include a storage device (e.g., drive unit) 508, a signal generation device 518 (e.g., a speaker), a network interface device 520, and one or more sensors 516, such as a global positioning system (GPS) sensor, compass, accelerometer, or other sensor. The machine 500 may include an output controller 528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 502, the main memory 504, the static memory 506, or the mass storage 508 may be, or include, a machine readable medium 522 on which is stored one or more sets of data structures or instructions 524 (e.g., software) embodying or utilized by any one or more of the techniques or functions described herein. The instructions 524 may also reside, completely or at least partially, within any of registers of the processor 502, the main memory 504, the static memory 506, or the mass storage 508 during execution thereof by the machine 500. In an example, one or any combination of the hardware processor 502, the main memory 504, the static memory 506, or the mass storage 508 may constitute the machine readable media 522. While the machine readable medium 522 is illustrated as a single medium, the term "machine readable medium" may include a single medium or multiple media (e.g., a centralized or distributed database, and/or associated caches and servers) configured to store the one or more instructions 524.

The term "machine readable medium" may include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine readable medium examples may include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media may include: non-volatile memory, such as semiconductor memory devices (e.g., Electrically Programmable Read-Only Memory (EPROM), Electrically Erasable Programmable Read-Only Memory (EEPROM)) and flash memory devices: magnetic disks, such as internal hard disks and removable disks: magneto-optical disks; and CD-ROM and DVD-ROM disks.

In an example, information stored or otherwise provided on the machine readable medium 522 may be representative of the instructions 524, such as instructions 524 themselves or a format from which the instructions 524 may be derived. This format from which the instructions 524 may be derived may include source code, encoded instructions (e.g., in compressed or encrypted form), packaged instructions (e.g., split into multiple packages), or the like. The information representative of the instructions 524 in the machine readable medium 522 may be processed by processing circuitry into the instructions to implement any of the operations discussed herein. For example, deriving the instructions 524 from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 524.

In an example, the derivation of the instructions 524 may include assembly, compilation, or interpretation of the information (e.g., by the processing circuitry) to create the instructions 524 from some intermediate or preprocessed format provided by the machine readable medium 522. The information, when provided in multiple parts, may be combined, unpacked, and modified to create the instructions 524. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 524 may be further transmitted or received over a communications network 526 using a transmission medium via the network interface device 520 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), LoRa/LoRaWAN, or satellite communication networks, mobile telephone networks (e.g., cellular networks such as those complying with 3G, 4G LTE/LTE-A, or 5G standards), Plain Old Telephone (POTS) networks, and wireless data networks (e.g., Institute of Electrical and Electronics Engineers (IEEE) 802.11 family of standards known as Wi-Fi®, IEEE 802.15.4 family of standards, peer-to-peer (P2P) networks, among others. In an example, the network interface device 520 may include one or more physical jacks (e.g., Ethernet, coaxial, or phone jacks) or one or more antennas to connect to the communications network 526. In an example, the network interface device 520 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 500, and includes digital or analog communications signals or other intangible medium to facilitate communication of such software. A transmission medium is a machine readable medium.

Additional Notes & Examples

Example 1 is a system for reducing a voltage-dependent effect of a first capacitor caused by a first voltage, the system comprising: the first capacitor, including a first physical spacing between a first capacitor terminal conductor of the first capacitor and a second capacitor terminal conductor of the first capacitor: a second capacitor, including a second physical spacing between a first capacitor terminal conductor of the second capacitor and a second capacitor terminal conductor of the second capacitor, wherein the second physical spacing is different from the first physical spacing; and a compensation circuit, arranged to receive and at least partially offset a voltage dependent signal contribution from each of the first and second capacitors for output to a signal-processing circuit.

In Example 2, the subject matter of Example 1 optionally includes wherein the compensation circuit includes a switched capacitor circuit, arranged to receive a charge contribution from each of the first and second capacitors and wherein a second voltage-dependent contribution from the second capacitor at least partially offsets a first voltage-dependent contribution from the first capacitor.

In Example 3, the subject matter of Example 2 optionally includes wherein the second voltage-dependent contribution subtracts from the first voltage-dependent contribution.

In Example 4, the subject matter of any one or more of Examples 1-3 optionally include wherein the compensation circuit includes a digital circuit, wherein the digital circuit is configured to receive a first digital representation corresponding to the first capacitor and a second digital representation corresponding to the second capacitor, wherein the digital circuit is configured to at least partially offset a voltage-dependent effect of the first capacitor using the first digital representation and the second digital representation.

In Example 5, the subject matter of any one or more of Examples 1-4 optionally include wherein a first capacitance value of the first capacitor and a second capacitance value of the second capacitor are selected such that a difference between the voltage-dependent contribution of the first capacitor and the voltage dependent contribution of the second capacitor provides a specified voltage dependent effect in the system.

In Example 6, the subject matter of Example 5 optionally includes wherein the first capacitance value and the second capacitance value are further selected such that the first capacitance value multiplied by a first voltage coefficient of the first capacitor is equal to the second capacitance value multiplied by a second voltage coefficient of the second capacitor.

In Example 7, the subject matter of any one or more of Examples 1-6 optionally include wherein a first capacitance value of the first capacitor is larger than a second capacitance value of the second capacitor and the first physical spacing is larger than the second physical spacing.

In Example 8, the subject matter of any one or more of Examples 1-7 optionally include wherein the signal-processing circuit includes at least one of a filter, an amplifier, an integrator, a summing circuit, or an analog-to-digital converter (ADC).

In Example 9, the subject matter of any one or more of Examples 1-8 optionally include a differential analog-to-digital converter (ADC) including: a first differential input terminal coupled to the second capacitor terminal conductor of the first capacitor; and a second differential input terminal coupled to the second capacitor terminal conductor of the second capacitor, wherein the first capacitor terminal conductor of the first capacitor and the first capacitor terminal conductor of the second capacitor are coupled together.

In Example 10, the subject matter of Example 9 optionally includes a third capacitor, including a third physical spacing between a first capacitor terminal conductor of the third capacitor and a second capacitor terminal conductor of the third capacitor, wherein the second capacitor terminal conductor of the third capacitor is connected to the second differential input terminal; and a fourth capacitor, including a fourth physical spacing between a first capacitor terminal conductor of the fourth capacitor and a second capacitor terminal conductor of the fourth capacitor, wherein a first capacitor terminal conductor of the fourth capacitor is connected to a first capacitor terminal conductor of the third capacitor, wherein a second capacitor terminal conductor of the fourth capacitor is coupled to the first differential input terminal.

In Example 11, the subject matter of Example 10 optionally includes wherein (1) the first physical spacing is equal to the third physical spacing, (2) a first capacitance of the first capacitor is equal to a third capacitance of the third capacitor, (3) the second physical spacing is equal to the fourth physical spacing, and (4) a second capacitance of the second capacitor is equal to a fourth capacitance of the fourth capacitor.

In Example 12, the subject matter of any one or more of Examples 1-11 optionally include wherein the system is included on a monolithic integrated circuit.

In Example 13, the subject matter of any one or more of Examples 1-12 optionally include wherein a construction of the first capacitor and the second capacitor include at least one of parallel plate style or finger style.

Example 14 is a method for reducing a non-linear effect of a first capacitor caused by a first voltage coefficient of the first capacitor, the method comprising: using the first capacitor, including a first physical spacing between a first capacitor terminal conductor of the first capacitor and a second capacitor terminal conductor of the first capacitor, to provide a first voltage-dependent contribution: using a second capacitor, including a second physical spacing between a first capacitor terminal conductor of the second capacitor and a second capacitor terminal conductor of the second capacitor, to provide a second voltage-dependent contribution, wherein the second physical spacing is different from the first physical spacing; and receiving, using a compensation circuit, the first voltage-dependent contribution and the second voltage-dependent contribution, wherein the second voltage-dependent contribution at least partially offsets the first voltage-dependent contribution.

In Example 15, the subject matter of Example 14 optionally includes using a first capacitance value of the first capacitor selected based at least in part upon respective voltage coefficients of the first capacitor and the second capacitor; and using a second capacitance value of the second capacitor selected based at least in part upon respective voltage coefficients of the first capacitor and the second capacitor.

In Example 16, the subject matter of Example 15 optionally includes wherein the using the first capacitance value and the using the second capacitance value are conducted to reduce a non-linearity in a combined effective capacitance value.

In Example 17, the subject matter of any one or more of Examples 14-16 optionally include using a first capacitance value of the first capacitor selected based at least in part upon an experiment conducted with a capacitor including the first physical spacing and a capacitor including the second physical spacing; and using a second capacitance value of the second capacitor selected based at least in part upon an experiment conducted with a capacitor including the first physical spacing and a capacitor including the second physical spacing.

Example 18 is a system for reducing a non-linear effect of a first capacitor caused by a first voltage coefficient of the first capacitor, the system comprising: the first capacitor, coupled between a first port and a second port; and a second capacitor, coupled between the first port and a third port, wherein the system is configured such that a capacitance coupled between the first port and the third port has a subtractive effect relative to an effect of a capacitance coupled between the first port and second port, wherein the first voltage coefficient of the first capacitor is different than a second voltage coefficient of the second capacitor.

In Example 19, the subject matter of Example 18 optionally includes wherein the different voltage coefficients of the first capacitor and the second capacitor are achieved at least in part using at least one of different plate spacings, different dielectric materials, or different capacitor designs between the first capacitor and second capacitor.

In Example 20, the subject matter of any one or more of Examples 18-19 optionally include wherein a first capacitance value of the first capacitor and a second capacitance value of the second capacitor are such that a difference between the first capacitance value and the second capacitance value provides a desired effective capacitance between the first port and the second port.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc., are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system for reducing a voltage-dependent effect of a first capacitor caused by a first voltage, the system comprising:
   the first capacitor, including a first physical spacing between a first capacitor terminal conductor of the first capacitor and a second capacitor terminal conductor of the first capacitor;
   a second capacitor, including a second physical spacing between a first capacitor terminal conductor of the second capacitor and a second capacitor terminal conductor of the second capacitor, wherein the second physical spacing is different from the first physical spacing; and
   a compensation circuit, arranged to receive and at least partially offset a voltage-dependent signal contribution from each of the first and second capacitors for output to a signal-processing circuit.

2. The system of claim 1, wherein the compensation circuit includes a switched capacitor circuit, arranged to receive a charge contribution from each of the first and second capacitors and wherein a second voltage-dependent contribution from the second capacitor at least partially offsets a first voltage-dependent contribution from the first capacitor.

3. The system of claim 2, wherein the second voltage-dependent contribution subtracts from the first voltage-dependent contribution.

4. The system of claim 1, wherein the compensation circuit includes a digital circuit, wherein the digital circuit is configured to receive a first digital representation corresponding to the first capacitor and a second digital representation corresponding to the second capacitor, wherein the digital circuit is configured to at least partially offset a voltage-dependent effect of the first capacitor using the first digital representation and the second digital representation.

5. The system of claim 1, wherein a first capacitance value of the first capacitor and a second capacitance value of the second capacitor are selected such that a difference between a first voltage-dependent contribution of the first capacitor and a second voltage-dependent contribution of the second capacitor provides a specified voltage-dependent effect in the system.

6. The system of claim 5, wherein the first capacitance value and the second capacitance value are further selected such that the first capacitance value multiplied by a first voltage coefficient of the first capacitor is equal to the second capacitance value multiplied by a second voltage coefficient of the second capacitor.

7. The system of claim 1, wherein a first capacitance value of the first capacitor is larger than a second capacitance value of the second capacitor and the first physical spacing is larger than the second physical spacing.

8. The system of claim 1, wherein the signal-processing circuit includes at least one of a filter, an amplifier, an integrator, a summing circuit, or an analog-to-digital converter (ADC).

9. The system of claim 1, comprising:
a differential analog-to-digital converter (ADC) including:
a first differential input terminal coupled to the second capacitor terminal conductor of the first capacitor; and
a second differential input terminal coupled to the second capacitor terminal conductor of the second capacitor, wherein the first capacitor terminal conductor of the first capacitor and the first capacitor terminal conductor of the second capacitor are coupled together.

10. The system of claim 9, comprising:
a third capacitor, including a third physical spacing between a first capacitor terminal conductor of the third capacitor and a second capacitor terminal conductor of the third capacitor, wherein the second capacitor terminal conductor of the third capacitor is connected to the second differential input terminal; and
a fourth capacitor, including a fourth physical spacing between a first capacitor terminal conductor of the fourth capacitor and a second capacitor terminal conductor of the fourth capacitor, wherein a first capacitor terminal conductor of the fourth capacitor is connected to a first capacitor terminal conductor of the third capacitor, wherein a second capacitor terminal conductor of the fourth capacitor is coupled to the first differential input terminal.

11. The system of claim 10, wherein (1) the first physical spacing is equal to the third physical spacing, (2) a first capacitance of the first capacitor is equal to a third capacitance of the third capacitor, (3) the second physical spacing is equal to the fourth physical spacing, and (4) a second capacitance of the second capacitor is equal to a fourth capacitance of the fourth capacitor.

12. The system of claim 1, wherein the system is included on a monolithic integrated circuit.

13. The system of claim 1, wherein a construction of the first capacitor and the second capacitor include at least one of parallel plate style or finger style.

14. A method for reducing a non-linear effect of a first capacitor caused by a first voltage coefficient of the first capacitor, the method comprising:
using the first capacitor, including a first physical spacing between a first capacitor terminal conductor of the first capacitor and a second capacitor terminal conductor of the first capacitor, to provide a first voltage-dependent contribution;
using a second capacitor, including a second physical spacing between a first capacitor terminal conductor of the second capacitor and a second capacitor terminal conductor of the second capacitor, to provide a second voltage-dependent contribution, wherein the second physical spacing is different from the first physical spacing; and
receiving, using a compensation circuit, the first voltage-dependent contribution and the second voltage-dependent contribution, wherein the second voltage-dependent contribution at least partially offsets the first voltage-dependent contribution for output to a signal processing circuit.

15. The method of claim 14, comprising:
using a first capacitance value of the first capacitor selected based at least in part upon respective voltage coefficients of the first capacitor and the second capacitor; and
using a second capacitance value of the second capacitor selected based at least in part upon respective voltage coefficients of the first capacitor and the second capacitor.

16. The method of claim 15, wherein the using the first capacitance value and the using the second capacitance value are conducted to reduce a non-linearity in a combined effective capacitance value.

17. The method of claim 14, comprising:
using a first capacitance value of the first capacitor selected based at least in part upon an experiment conducted with a capacitor including the first physical spacing and a capacitor including the second physical spacing; and
using a second capacitance value of the second capacitor selected based at least in part upon an experiment conducted with a capacitor including the first physical spacing and a capacitor including the second physical spacing.

* * * * *